US008561815B2

(12) United States Patent
Higson

(10) Patent No.: US 8,561,815 B2
(45) Date of Patent: Oct. 22, 2013

(54) MOUNTING FRAMES FOR HOLDING ELECTRONIC DEVICES

(75) Inventor: Paul James Higson, Chellaston (GB)

(73) Assignee: Fisher-Rosemount Systems, Inc., Austin, TX (US)

( * ) Notice: Subject to any disclaimer, the term of this patent is extended or adjusted under 35 U.S.C. 154(b) by 849 days.

(21) Appl. No.: 12/562,667

(22) Filed: Sep. 18, 2009

(65) Prior Publication Data

US 2011/0069471 A1     Mar. 24, 2011

(51) Int. Cl.
*A47G 19/08*        (2006.01)
(52) U.S. Cl.
USPC .......................................... 211/41.17; 248/49
(58) Field of Classification Search
USPC ........... 211/26, 26.2, 41.17; 248/49; 385/134, 385/135; 439/110, 111, 209, 211; 174/117 F, 494; 362/648, 362; 52/126.6, 220.3, 220.6
See application file for complete search history.

(56) References Cited

U.S. PATENT DOCUMENTS

| | | | | |
|---|---|---|---|---|
| 2,904,621 | A * | 9/1959 | Grier | 174/126.1 |
| 3,821,688 | A * | 6/1974 | Larsile | 439/209 |
| 3,919,457 | A * | 11/1975 | Steiner | 174/491 |
| 4,099,626 | A * | 7/1978 | Magnussen, Jr. | 211/60.1 |
| 4,199,070 | A * | 4/1980 | Magnussen, Jr. | 211/60.1 |
| 4,881,907 | A * | 11/1989 | Bergman et al. | 439/111 |
| 5,023,404 | A * | 6/1991 | Hudson et al. | 174/97 |
| 5,642,612 | A * | 7/1997 | Hughes | 59/78.1 |
| 6,185,098 | B1 | 2/2001 | Benavides | |
| 6,256,443 | B1 * | 7/2001 | Uruno et al. | 385/134 |
| 6,706,969 | B1 * | 3/2004 | Young | 174/95 |
| 6,854,397 | B2 * | 2/2005 | Terajima et al. | 104/95 |
| 8,132,776 | B2 * | 3/2012 | Sladojevic | 249/139 |
| 2003/0043566 | A1 | 3/2003 | Tsunoda et al. | |
| 2003/0146011 | A1 | 8/2003 | Thielmann et al. | |
| 2008/0062655 | A1 | 3/2008 | Laursen et al. | |

FOREIGN PATENT DOCUMENTS

| | | |
|---|---|---|
| CH | 687947 | 3/1997 |
| EP | 1345482 | 9/2003 |
| EP | 1578143 | 9/2005 |
| EP | 1893009 | 2/2008 |
| FR | 2242793 | 3/1975 |
| FR | 2589291 | 4/1987 |
| JP | 60-186094 | 9/1985 |
| WO | 01/91529 | 11/2001 |

OTHER PUBLICATIONS

The Intellectual Property Office, "Search Report," Great Britain application No. GB 1015587.7, Feb. 1, 2011, 5 pages.
The Intellectual Property Office of Great Britain, "Examination Report under section 18 (3)," Great Britain application No. GB 1015587.7, Jul. 9, 2013, 2 pages.

* cited by examiner

*Primary Examiner* — Korie H Chan
(74) *Attorney, Agent, or Firm* — Hanley, Flight & Zimmerman, LLC

(57) ABSTRACT

Mounting frames for holding electronic devices are described. An example mounting frame for holding electronic devices includes an elongated extruded body having two substantially parallel wiring cavities extending along a length of the body and separated by a wall within the body. The wiring cavities have respective openings facing in opposite directions, and opposing faces of the body have respective process control device mounting rails and respective mounting channels. Each of the mounting channels is configured to hold the mounting frame to a structure.

18 Claims, 9 Drawing Sheets

MOUNTING FRAMES FOR HOLDING ELECTRONIC DEVICES

FIELD OF THE DISCLOSURE

This patent relates generally to mounting frames and, more particularly, to mounting frames for holding electronic devices.

BACKGROUND

Some communication, power distribution, media distribution, process control, computing, etc. systems include a bus, base, rack and/or frame to which a plurality of pluggable, insertable, installable and/or field replaceable modules can be electrically and/or communicatively coupled. An example bus, base, rack and/or frame includes a plurality of sockets, connectors and/or slots into which different modules can be inserted and/or plugged.

The modules may be electrically coupled to various electrical cables or wires. These electrical cables or wires typically converge at the bus, base, rack and/or frame to which the modules are mounted or installed. As a result, relatively large numbers of electrical devices (e.g., modules) and large amounts of wire must be routed and organized within a relatively small amount of available space surrounding the bus, base, rack and/or frame.

SUMMARY

An example mounting frame for holding electronic devices includes an elongated extruded body having two substantially parallel wiring cavities extending along a length of the body and separated by a wall within the body. The wiring cavities have respective openings facing in opposite directions, and opposing faces of the body have respective process control device mounting rails and respective mounting channels, where each of the mounting channels is configured to hold the mounting frame to a structure.

DETAILED DESCRIPTION

Certain examples are shown in the above-identified figures and described in detail below. In describing these examples, like or identical reference numbers are used to identify the same or similar elements. The figures are not necessarily to scale and certain features and certain views of the figures may be shown exaggerated in scale or in schematic for clarity and/or conciseness. Additionally, several examples have been described throughout this specification. Any features from any example may be included with, a replacement for, or otherwise combined with other features from other examples.

Figure 1:
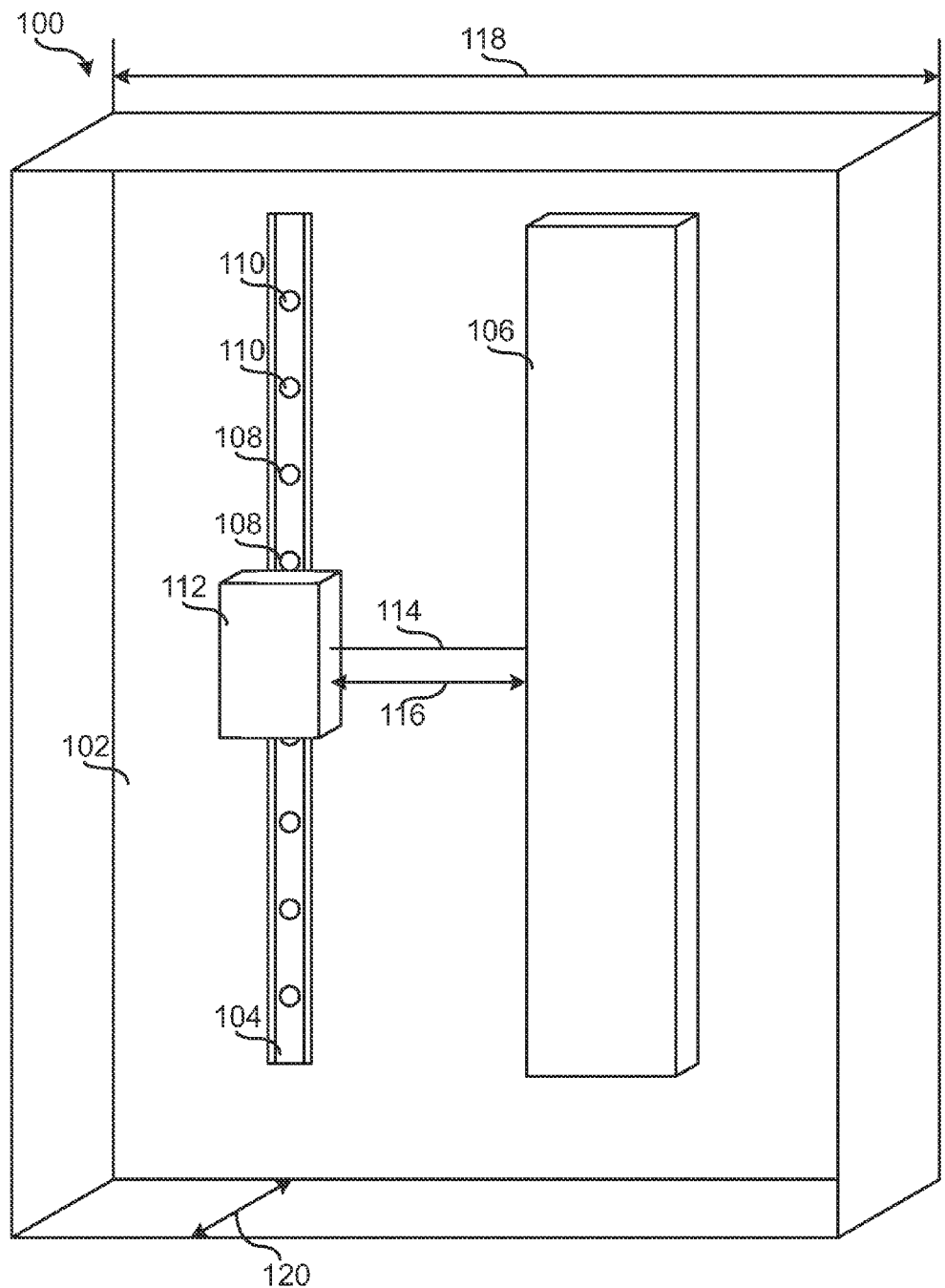
FIG. 1 depicts a cabinet to which a known mounting rail and a known cable tray are coupled.

FIG. 1 depicts a cabinet 100 having a solid back panel 102 to which a mounting rail 104 and a cable tray or wiring trough 106 are directly mounted. The mounting rail 104 defines a plurality of apertures 108 through which fasteners 110 extend to couple the mounting rail 104 directly to the solid back panel 102. Coupling the mounting rail 104 to the solid back panel 102 enables one or more electronic device(s) 112 to be securely fastened to the mounting rail 104 within the cabinet 100.

Spaced from the mounting rail 104, the cable tray 106 may be similarly coupled to the solid back panel 102 via fasteners (not shown). One or more wire(s) or cable(s) 114 electrically coupled to the one or more electronic device(s) 112 may extend a distance 116 from the electronic device(s) 112 to the cable tray 106. The cable tray 106 enables wires or cables to be relatively organized within the cabinet 100.

However, in such known configurations, both the mounting rail 104 and the cable tray 106 are mounted directly to the solid back panel 102. As a result, a significant portion of a width 118 of the solid back panel 102 is occupied by the mounting rail 104, the cable tray 106 and the electronic device(s) 112, while a significant portion of a depth 120 of the cabinet 100 is not sufficiently utilized or occupied. Therefore, in some instances, a greater number of cabinets must be designed and manufactured to mount the required number of electronic devices needed for a given facility (e.g., a process control plant). An inherent drawback of having more cabinets in the given facility is the large amount of floor and/or wall space occupied by such cabinets. Additionally, because such known configurations are typically custom designed and manufactured, these configurations are inherently non-versatile and require significant amounts of time to design and manufacture and, thus, are relatively expensive and difficult to modify.

Figure 2:
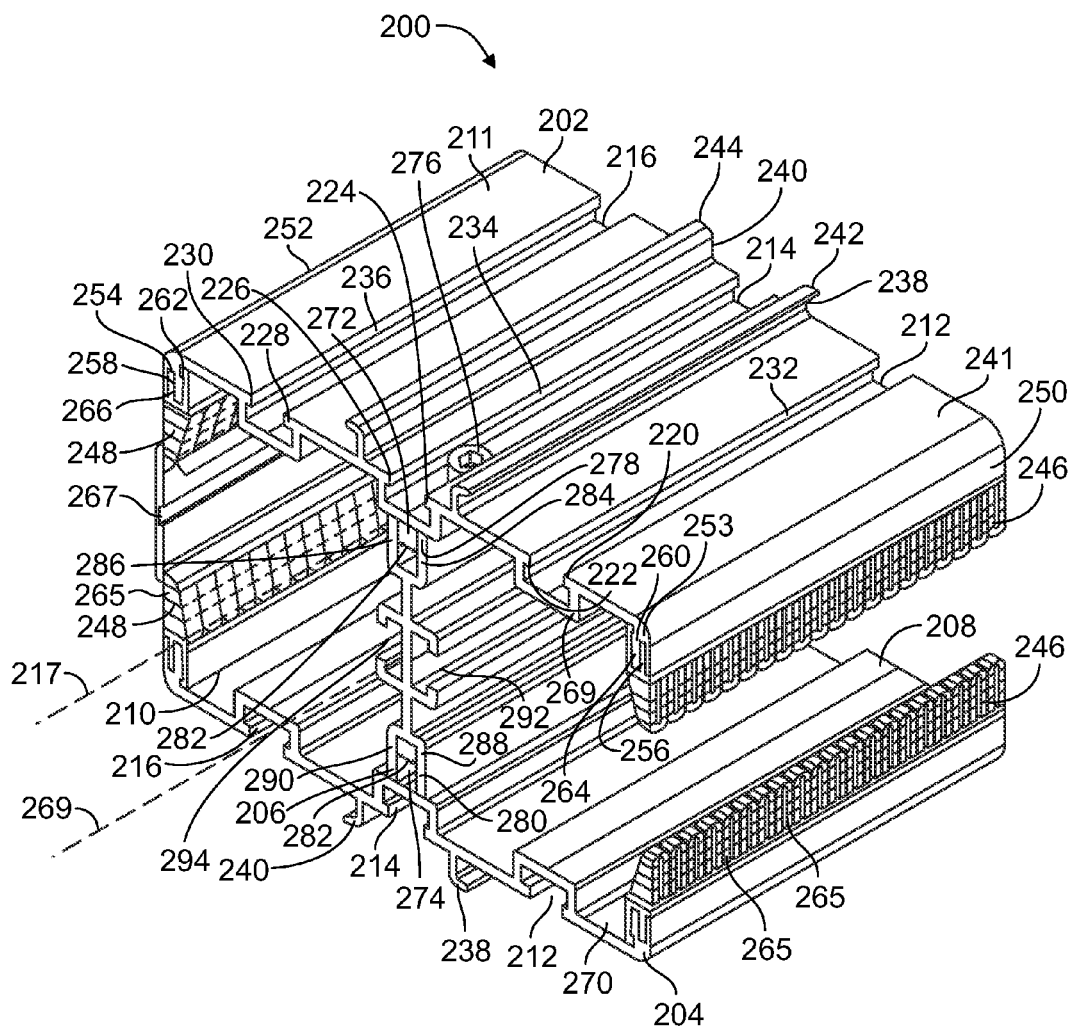
FIGS. 2-4 depict different views of an example mounting frame.

FIG. 2 depicts an example mounting frame 200 that includes first and second opposing frame portions or plate portions 202 and 204 that may be substantially parallel to one another. The example mounting frame 200 also includes a wall, spacer, rib, spine or central beam 206 that may be substantially perpendicular to the first and second frame portions 202 and 204. The frame portions 202 and 204 and the spacer 206 may be made from any suitable material such as, for example, a metallic material (e.g., aluminum) and may be produced using any suitable method such as, for example, an extrusion process and/or a roll-forming process.

The spacer 206 separates the first frame portion 202 from the second frame portion 204 and defines a first wiring cavity or wiring trough 208 and a second wiring cavity or wiring trough 210. The first and second wiring cavities 208 and 210 may be substantially parallel to each other and extend along a length of the mounting frame 200. Advantageously, providing the mounting frame 200 with the first and second wiring cavities 208 and 210 enables wires or cables associated with a first type of device(s) and/or current type (e.g., alternating current (AC) or direct current (DC)) to be positioned in the first wiring cavity 208 while wires or cables associated with a second type of device(s) or current type may be positioned in the second wiring cavity 210, for example.

The first frame portion 202 includes an elongated plate 211 that defines a plurality of laterally spaced channels 212, 214 and 216 that may be substantially parallel to a longitudinal axis 217 of the first frame portion 202. The channels 212-216 include inwardly extending lips 220-230 to enable a portion of a securing apparatus or mounting bracket 500 (FIG. 5) and/or a nut or other fastener (not shown) to be retained or captured within the corresponding channel 212-216. Additionally, the channels 212-216 define openings or apertures 232, 234 and 236 to enable a fastener or bolt to extend through the openings 232-236 and to be received by the mounting bracket 500 (FIG. 5), nut or other fastener, for example.

Additionally, first and second walls or extensions 238 and 240 may extend substantially perpendicularly from an exterior surface or face 241 of the elongated plate 211 on opposing sides of the channel 214. However, the extensions 238 and 240 may be positioned differently on the exterior surface 241 or the first frame portion 202 may not be provided with the extensions 238 and 240. The extensions 238 and 240 include opposing lips 242 and 244 that may form a mounting rail, a Deutsches Institut für Normung e.V. (DIN) rail or a top-hat rail, for example, that enable a process control device and/or an electronic device or module to be secured or mounted relative to the mounting frame 200. Specifically, the electronic device may receive and be held in place by an interaction between a portion (not shown) of the electronic device and the extensions 238 and 240.

To enable wire guides or wire combs 246 and 248 to be coupled to lateral edges 250 and 252 of the first frame portion 202, in this example, the lateral edges 250 and 252 define channels or grooves 253 and 254 that receive a tongue or portion 256 and 258 of the respective wire guide 246 and 248 and, adjacent the channels 253 and 254, the lateral edges 250 and 252 include a tongue or portion 260 and 262 that is received by a channel or groove 264 or 266 of the respective wire guide 246 and 248. In this example, a friction fit or interference fit between the channels 253 and 254 and 264 and 266 and the respective tongues 256 and 258 and 260 and 262 couple the wire guides 246 and 248 to the first frame portion 202. The wire guides 246 and 248 include a plurality of flexible fingers or portions 265 between which wires or cables may be securely held, for example. To enable relatively easy access to the first wiring cavity 208 and/or the second wiring cavity 210 while enabling the cavities 208 and 210 to be enclosed, a cover 267 may be positioned between the opposing wire guides 246 and 248. The cover 267 may be made of any suitable material such as, for example, a plastic material, a metallic material, etc.

In this example, the first and second frame portions 202 and 204 are substantially mirror images of one another and may be symmetrical about a longitudinal axis 268 of the mounting frame 200. However, in other examples, the first frame portion 202 may be different than the second frame portion 204. For example, the first frame portion 202 may define the channels 212-216 and the extensions 238 and 240 and the second frame portion 204 may not include or define the extensions 238 and 240 and/or some or all of the channels 212-216. Additionally or alternatively, some or all of the channels 212-216 and/or the extensions 238 and 240 of the first frame portion 202 may be offset relative to the channels 212-216 and/or the extensions 238 and 240 of the second frame portion 204.

The spacer 206 is positioned between interior surfaces 269 and 270 of the first and second frame portions 202 and 204, respectively. The spacer 206 includes a plurality of apertures or channels 272 and 274 that receive fasteners (one of which is represented by reference number 276) to couple the frame portions 202 and 204 to the spacer 206. In some examples, ribs 278 and 280 extend along a length of the apertures 272 and 274. The ribs 278 and 280 may be sized and/or spaced to threadably engage threads on the fasteners. However, the spacer 206 may not include the ribs 278 and 280. In such examples, a distance 282 between walls 284, 286, 288 and 290 of the spacer 206 that define the apertures 272 and 274 may be slightly undersized relative to the fastener such that threads may be formed in the walls 284-290 as the fastener is threaded through the respective frame portion 202 or 204 and into the respective aperture 272 and 274.

Additionally, the spacer 206 may include a plurality of opposing channels 292 and 294 that may be similar to the channels 212-216 of the first and/or second frame portions 202 and/or 204. The channels 292 and 294 may receive a portion 614 (FIG. 6) of a wire tie device or cradle 612 (FIG. 6), which may enable wires or cables that extend through the wiring cavities 208 and 210 to be secured relative to the spacer 206 and, thus, organized within the respective wiring cavity 208 and 210.

Figure 3:
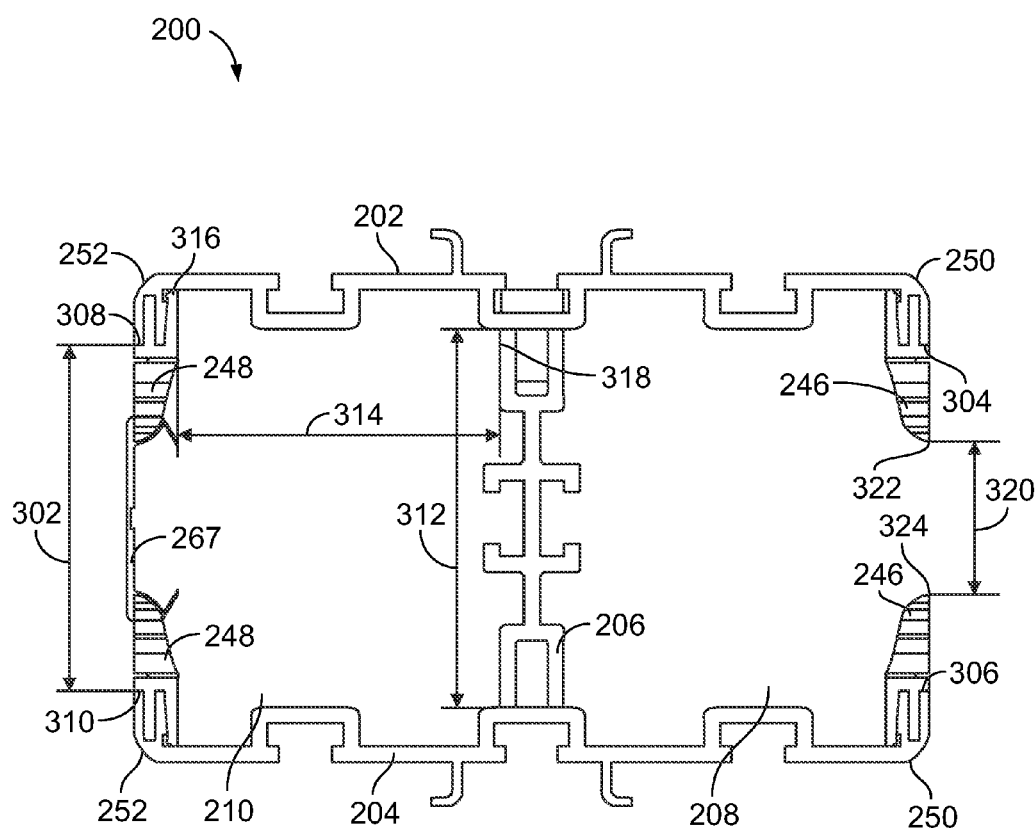

FIG. 3 depicts a cross-sectional view of the example mounting frame 200 including the first and second frame portions 202 and 204, the spacer 206, the wire guides 246 and 248 and the cover 267. While not shown, a cover similar to the cover 267 may be positioned between the wire guides 246.

In some examples, a distance 302 between surfaces 304 and 306 and 308 and 310 of the respective lateral edges 250 and 252 may be approximately 60 millimeters (mm) and/or a height 312 of the spacer 206 may be approximately 66 mm. However, the height 312 of the spacer 206 may be adjusted to change the size of the wiring cavities 208 and 210 or for any other reason. Advantageously, the height 312 may be changed without changing any of the dimensions of the first and second frame portions 202 and 204. Additionally or alternatively, in some examples, a distance 314 between an inner surface 316 of the wire guide 248 and a surface 318 of the spacer 206 may be approximately 57 mm and/or a distance 320 between ends 322 and 324 of the wire guides 246 may be approximately 30 mm. However, the example distances or lengths noted above can be varied as needed to suit a particular application.

Figure 4:
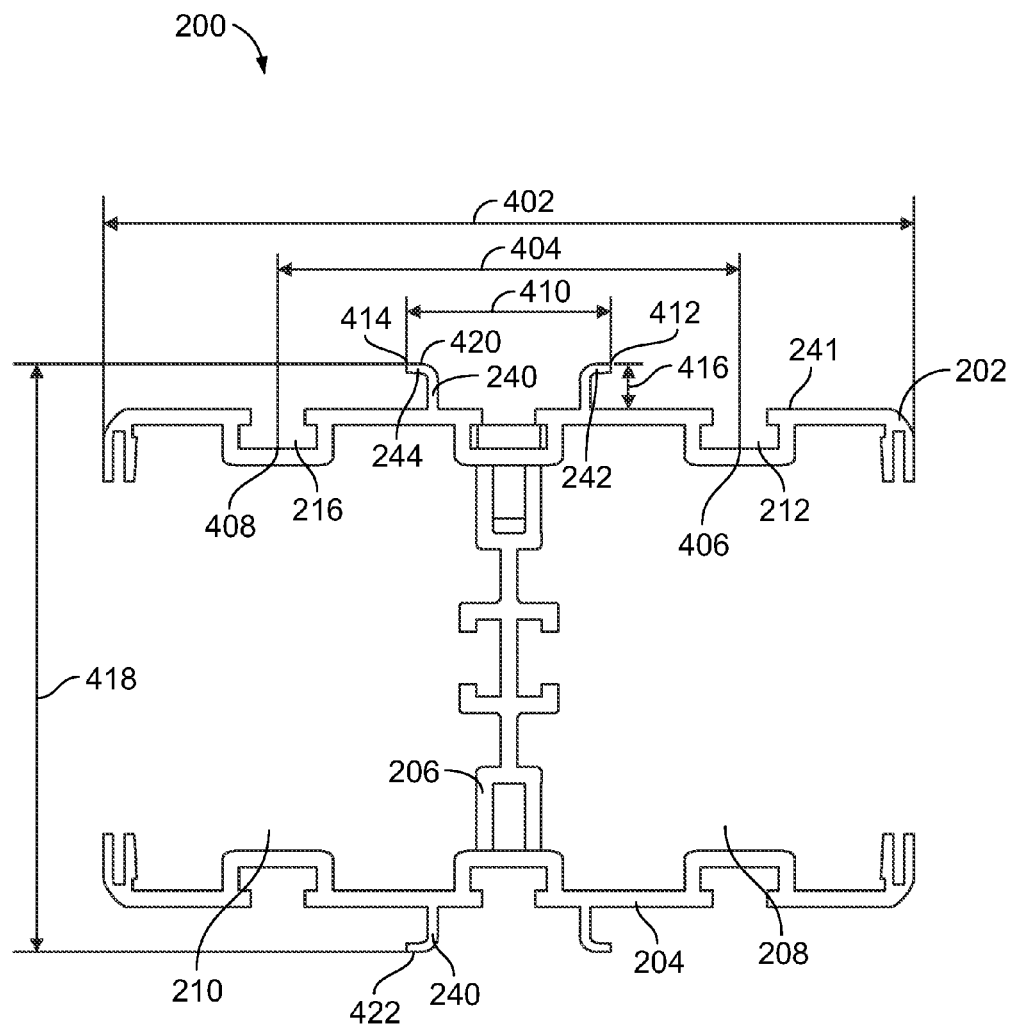

FIG. 4 depicts another cross-sectional view of the example mounting frame 200 including the first and second frame portions 202 and 204 and the spacer 206. In some examples, a width 402 of the first frame portion 202 and the second frame portion 204 may be approximately 140 mm and/or a distance 404 between a center 406 and 408 of the respective channels 212 and 216 may be approximately 80 mm. However, the width 402 may be adjusted to change the size of the wiring cavities 208 and 210 or for any other reason. Advantageously, the width 402 may be changed without changing any of the dimensions of the spacer 206. Additionally or alternatively, a distance 410 between ends 412 and 414 of the lips 242 and 244 may be approximately 35 mm, a distance 416 between the exterior surface 241 and the end 412 may be approximately 7.5 mm and/or a distance 418 between surfaces 420 and 422 of the extensions 240 of the first and second frame portions 202 and 204 may be approximately 99.6 mm. However, the example distances or lengths noted above can be varied as needed to suit a particular application.

Figure 5:
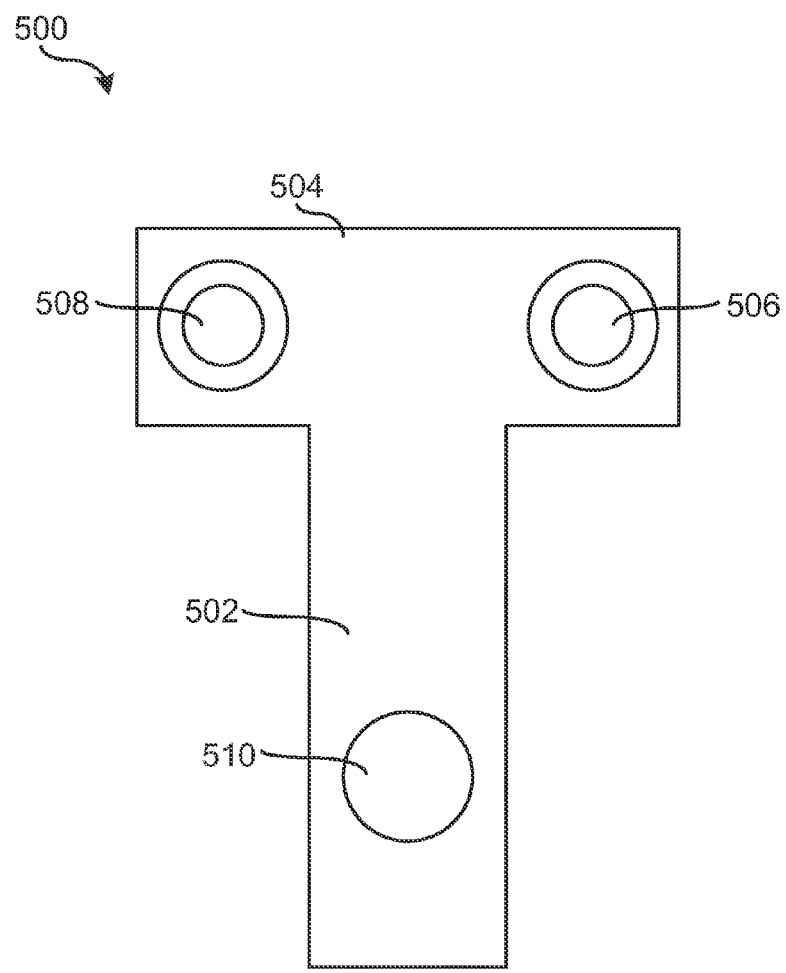
FIG. 5 depicts an example mounting bracket that can be used in connection with the example mounting frame of FIGS. 2-4.
Figure 6:
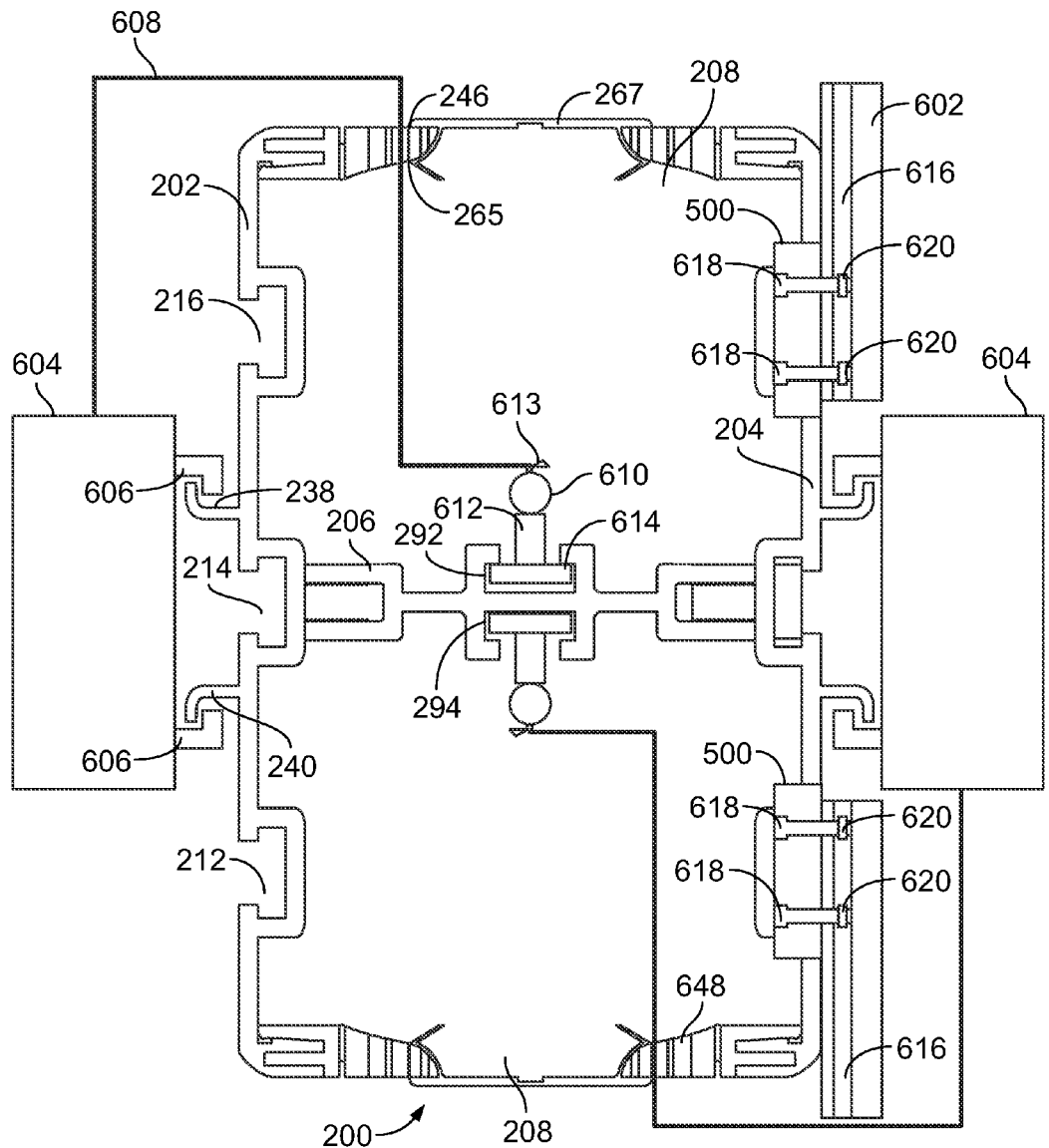
FIGS. 6 and 7 depict different views the example mounting frame of FIGS. 2-4 coupled to a structure.

FIG. 5 depicts the securing apparatus or mounting bracket 500 that includes an elongated portion or tab 502 to be inserted into one of the channels 212-216 and a transverse or lateral portion 504 that is to extend from the mounting frame 200 and which may be coupled directly to a structure 602 (FIG. 6). The lateral portion 504 defines a plurality of tapered apertures 506 and 508 to receive a plurality of fasteners 618 (FIG. 6) to mount the mounting frame 200 (FIG. 2) to the structure 602 (FIG. 6). The elongated portion 502 defines an aperture 510 through which a fastener (not shown) may extend to more securely couple the mounting frame 200 to the mounting bracket 500. However, the mounting bracket 500 may not include the aperture 510 in some examples. In this example, the mounting bracket 500 is a substantially T-shaped bracket. However, the mounting bracket 500 may have any other suitable shape.

Figure 7:
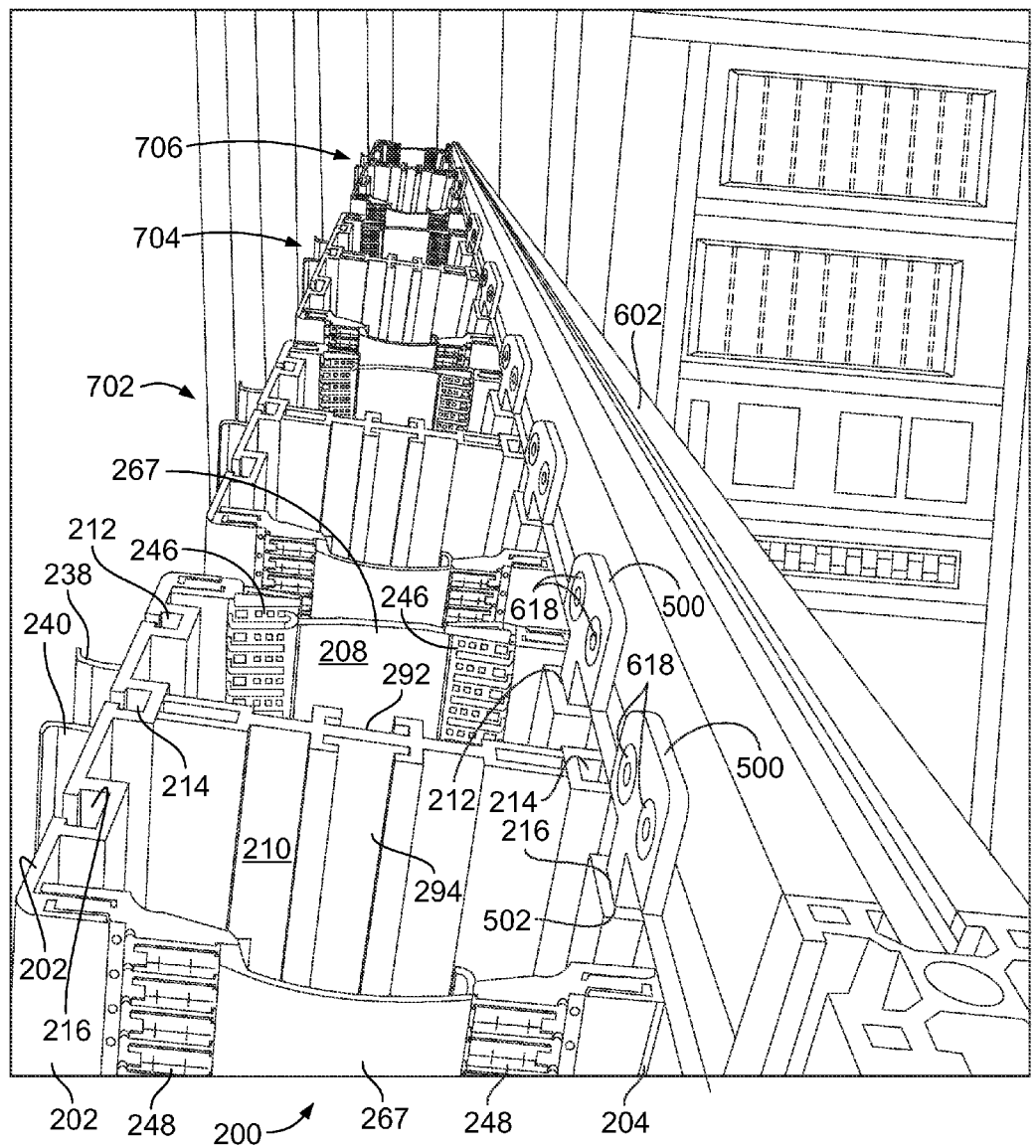

FIGS. 6 and 7 depict different views of the example mounting frame 200 coupled to the structure 602 and shown partially cut away in FIG. 6. Additionally, FIG. 6 depicts how one or more electronic device(s) (e.g., process control device(s)) 604 may coupled to the mounting frame 200 via an interaction between a portion (e.g., a hook or lip) 606 of the electronic device 604 and the extensions 238 and 240 on either the first frame portion 202 and/or the second frame portion 204. Mounting the one or more of the electronic device(s) 604 via the extensions 238 and 240 of the first portion 202 and the second portion 204 further utilizes space available within the cabinet 100 (FIG. 1), thereby maximizing the number of electronic devices that may be positioned in a single cabinet, for example.

One or more wire(s) or cable(s) 608 electrically coupled to the one or more of the electronic device(s) 604 may extend from the electronic device(s) 604 through the fingers 265 of the wire guides 246 and 248 and toward an aperture 610 of the wire tie device or cradle 612. The one or more wire(s) or cables(s) 608 may be secured relative to the wire tie device 612 by any suitable method such as threading a wire tie 613 through the aperture 610 and then coupling the one or more wire(s) or cables(s) 608 to the wire tie device 612 via the wire tie 613, for example. The portion 614 of the wire tie device 612 may be positioned within either of the channels 292 or 294 of the spacer 206 to secure the wire tie device 612 relative to the mounting frame 200 via a fastener (not shown).

To secure or mount the mounting frame 200 to the structure 602 having a lower channel (not shown) that may be substantially parallel to an upper channel 616, in some examples, two of the mounting brackets 500 may be positioned adjacent the lower channel (similar to the upper channel 616) of the structure 602 such that the elongated portion 502 of the mounting bracket 500 extends toward the upper channel 616. Fasteners (similar to the fasteners 618) may then be inserted through the respective tapered apertures 506 and 508 of the mounting bracket 500 and into the lower channel to be received by a nut (similar to a nut 620) captured within the lower channel. The channels 212 and 216 of the mounting frame 200 may then be aligned with the elongated portions 502 of the mounting brackets 500 extending from the lower channel. The elongated portions 502 may then be inserted into respective ones of the channels 212 and 216. The mounting frame 200 may then be moved toward the upper channel 616 of the structure 602 and two additional mounting brackets 500 may be inserted into the channels 212 and 216 on an opposite end of the mounting frame 200. The fasteners 618 may then be inserted through the respective tapered apertures 506 and 508 and into the upper channel 616 to be received by the respective nuts 620 captured within the upper channel 616. Once the mounting frame 200 is secured relative to the structure 602, the one or more electronic device(s) 604 may be coupled to the extensions 238 and 240 and the one or more wire(s) or cable(s) 608 may be fed through the fingers 265 of the wire guides 246 and 248 and coupled to the wire tie device 612 within the first wiring cavity 208 and/or the second wiring cavity 210, for example. The cover 267 may then be snapped in place between the wire guides 246 and 248. FIG. 7 additionally depicts additionally mounting frames 702, 704 and 706 mounted to the structure 602.

Figure 8:
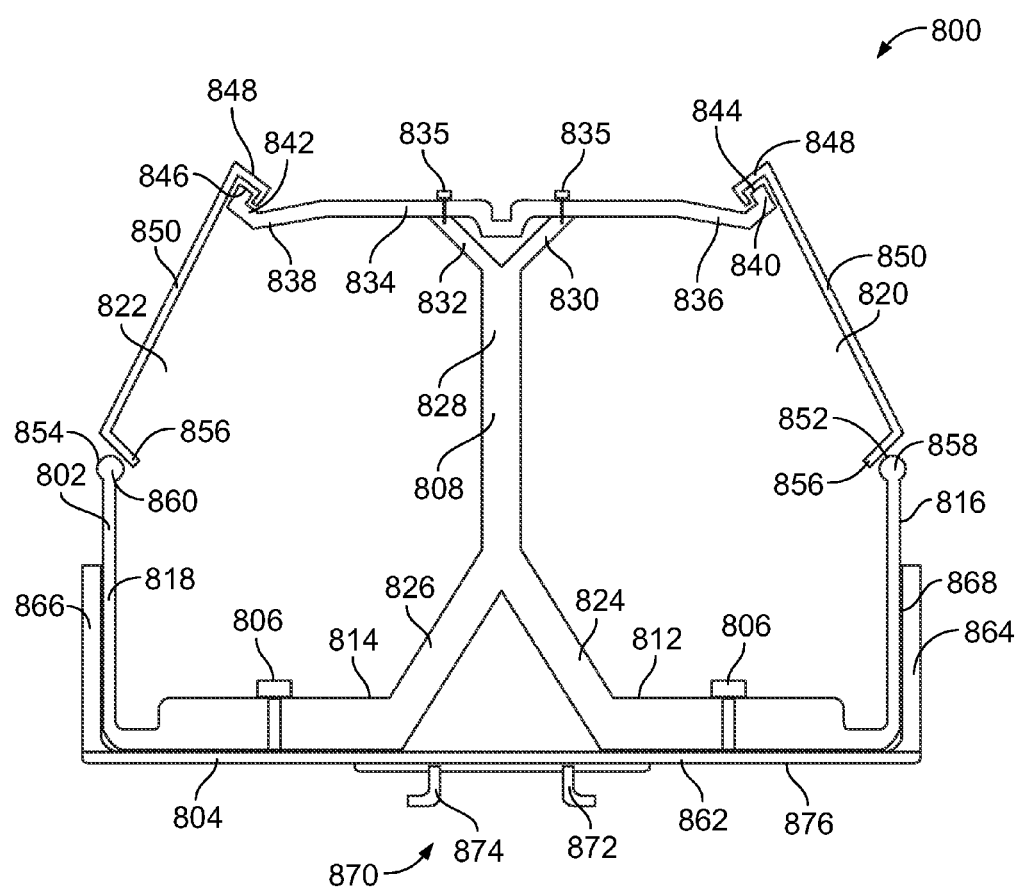
FIGS. 8 and 9 depict different views of an alternative example mounting frame.

FIG. 8 depicts a cross-sectional view of an alternative mounting frame 800. The mounting frame 800 includes an elongated body or frame 802 and an elongated mounting plate portion 804 that may be coupled to the elongated body 802 by one or more fasteners 806. The elongated body 802 and/or the elongated mounting plate portion 804 may be made from any suitable material such as, for example, a metallic material (e.g., aluminum) and may be produced using any suitable method such as, for example, an extrusion process and/or a roll-forming process.

The elongated body 802 includes a spine, wall or spacer 808, a plurality of laterally extending portions 812 and 814 and a plurality of walls 816 and 818 that may extend perpendicularly from the respective portions 812 and 814. The spine 808, the laterally extending portions 812 and 814 and the walls 816 and 818 may at least partially define at least one of a first wiring cavity or wiring trough 820 and a second wiring cavity or wiring trough 822. The wiring cavities 820 and 822 may be substantially parallel to each other and extend along a length of the mounting frame 800.

The spine 808 includes a first plurality of supports 824 and 826 that extend from a central portion 828 of the spine 808 toward the laterally extending portions 812 and 814. Additionally, the spine 808 includes a second plurality of supports 830 and 832 that extend outwardly from the central portion 828 toward a plate 834 that may be coupled to the second plurality of supports 830 and 832 via a plurality of fasteners 835.

The plate 834 may include a plurality of wire guides 836 and 838 (shown most clearly in FIG. 9) extending along lateral edges 840 and 842 of the plate 834. In some examples, the lateral edges 840 and 842 may include lips 844 and 846 that are engaged by a portion 848 of a cover 850 that may cover openings 852 and 854 of the wiring cavities 820 and 822. Additionally, the cover 850 may include a leg or tapered portion 856 to frictionally engage an end 858 and 860 of the respective walls 816 and 818 to maintain the position of the cover 850 relative to the respective openings 852 and 854.

The elongated mounting plate portion 804 includes an elongated plate section 862 and walls 864 and 866 that may extend substantially perpendicularly from the elongated plate section 862. The walls 864 and 866 define a chamber 868 into which the elongated body 802 is at least partially positioned. Additionally, the elongated mounting plate portion 804 includes a mounting rail 870 having extensions or walls 872 and 874 that extend substantially perpendicularly from an exterior surface 876 of the elongated plate section 862. As discussed above, the extensions 872 and 874 may be received by a portion of one or more electronic device(s).

Figure 9:
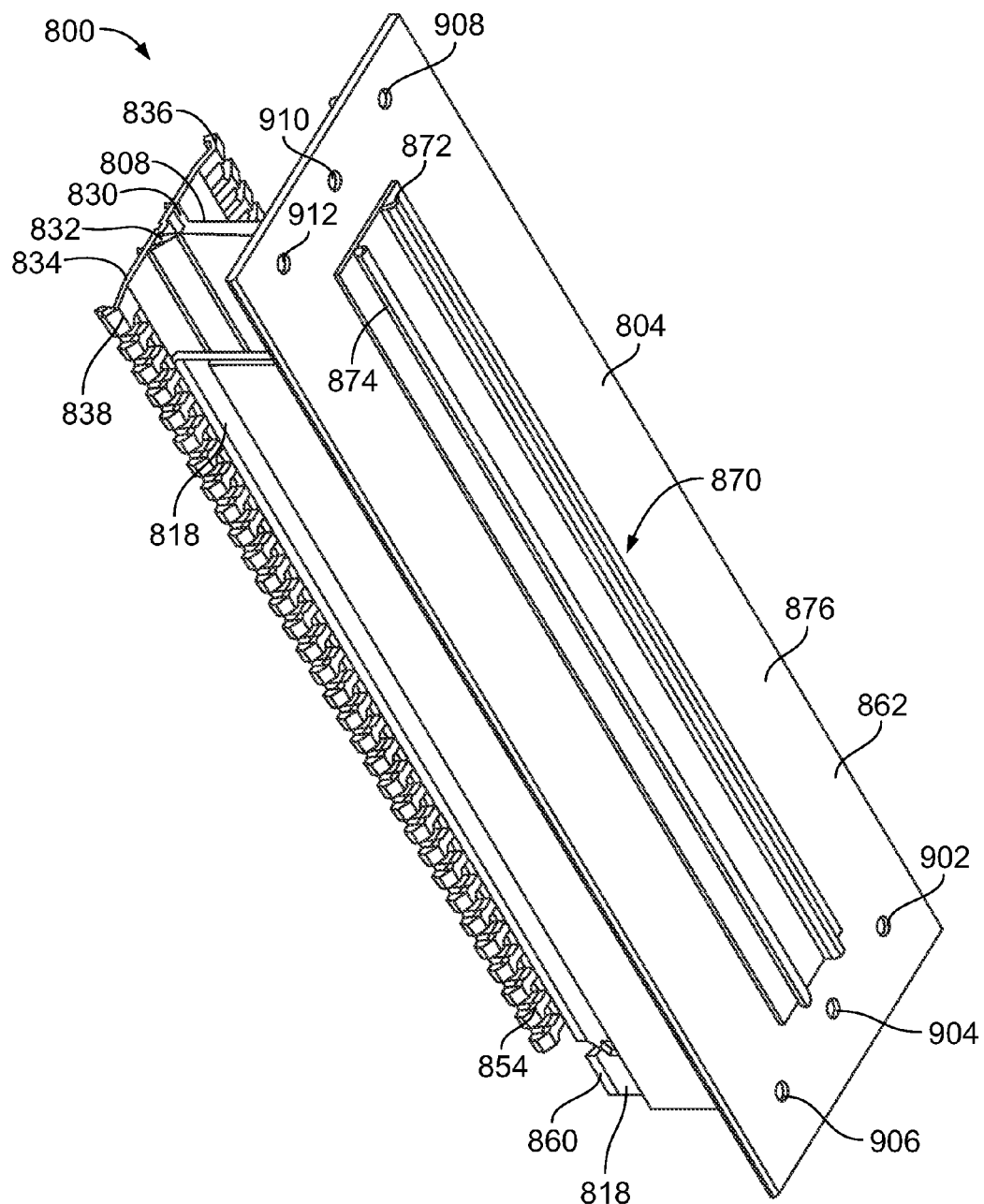

FIG. 9 depicts the frame member 800 without the covers 850. To secure the frame member 800 relative to a structure (such as the structure 600 of FIG. 6), the elongated plate section 862 defines a plurality of apertures 902-912 that are to receive corresponding fasteners.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A mounting frame for holding electronic devices, comprising:

first and second opposing frame portions, each of which comprises an elongated plate having an interior surface, an exterior surface and a lateral edge extending along the elongated plate, the lateral edge including a first channel configured to receive a guide for electrical wires, wherein the first frame portion comprises:

a plurality of second channels, each of the second channels extending parallel to a longitudinal axis of the first frame portion and along a length of the exterior surface of the first frame portion, each of the second channels being configured to receive a portion of a securing apparatus to enable the mounting frame to be secured relative to a structure; and a plurality of walls extending substantially perpendicularly away from the exterior surface of the first frame portion, each of the walls having a lip to mountably receive a portion of an electronic device; and a spacer extending between the interior surfaces of the first and second frame portions to define a first wiring cavity and a second wiring cavity, each of the wiring cavities defined by the spacer and the interior surfaces of the frame portions and extending along the frame portions.

2. The mounting frame as defined in claim 1, wherein the second frame portions comprises:

a plurality of third channels, each of the third channels extending parallel to a longitudinal axis of the second frame portion and along a length of the exterior surface of the second frame portion, each of the third channels being configured to receive a portion of a securing apparatus to enable the mounting frame to be secured relative to a structure; and a second plurality of walls extending substantially perpendicularly away from the exterior surface of the second frame portion, each of the walls having a lip to mountably receive a portion of an electronic device.

3. The mounting frame as defined in claim 1, wherein the first and second frame portions are symmetric relative to each other.

4. The mounting frame as defined in claim 1, wherein the spacer defines apertures to receive threaded fasteners to couple the spacer to the first and second frame portions.

5. The mounting frame as defined in claim 4, wherein each of the apertures comprises a ribbed channel extending along a length of the spacer.

6. The mounting frame as defined in claim 1, wherein the spacer comprises respective channels extending along a surface of the spacer and a second surface of the spacer opposite the surface, wherein each of the opposing channels is configured to receive at least a portion of a wire tie device.

7. The mounting frame as defined in claim 1, wherein the spacer or at least one of the frame portions comprises extruded material.

8. The mounting frame as defined in claim 7, wherein the extruded material comprises aluminum.

9. The mounting frame as defined in claim 1, wherein the walls and lips form a mounting rail, and wherein the electronic device is a process control device.

10. The mounting frame as defined in claim 1, further comprising a first wire guide coupled to one of the channels of one of the lateral edges of the first frame portion and a second wire guide opposing the first wire guide and coupled to one of the channels of one of the lateral edges of the second frame portion.

11. The mounting frame as defined in claim 10, wherein the first and second wire guides comprise a plurality of flexible fingers to hold electrical wires extending between the electronic device and one of the wiring cavities.

12. The mounting frame as defined in claim 10, further comprising a cover to cover an opening between the wire guides, wherein the opening is adjacent the one of the wiring cavities and extends along a length of the one of the wiring cavities.

13. The mounting frame as defined in claim 1, wherein the portion of the securing apparatus comprises a portion of a bracket.

14. The mounting frame as defined in claim 13, wherein the bracket comprises a T-shaped bracket.

15. A mounting frame for holding electronic devices, comprising:

an elongated extruded body having two substantially parallel plate portions and a wall between and substantially perpendicular to the plate portions, wherein interior surfaces of the plate portions and opposing surfaces of the wall define parallel wiring cavities separated by the wall and extending along a length of the body, wherein at least one exterior surface of the one of the parallel plate portions includes a mounting rail to mountably receive at least a portion of a process control device, wherein the body includes at least one mounting channel in an exterior surface of one of the plate portions, the mounting channel being configured to receive a mounting bracket to fix the body relative to a structure, and wherein lateral edges of the plate portions include channels to receive respective wire guides.

16. The mounting frame of claim 15, wherein the elongated extruded body comprise a metallic material.

17. The mounting frame of claim 15, wherein the plate portions are symmetric relative to each other.

18. The mounting frame of claim 15, wherein the wall comprises a channel to receive at least a portion of a wire tie device.

* * * * *